United States Patent
Yagi et al.

(10) Patent No.: US 10,385,457 B2
(45) Date of Patent: Aug. 20, 2019

(54) RAW MATERIAL GAS SUPPLY APPARATUS, RAW MATERIAL GAS SUPPLY METHOD AND STORAGE MEDIUM

(71) Applicant: TOKYO ELECTRON LIMITED, Tokyo (JP)

(72) Inventors: Hironori Yagi, Yamanashi (JP); Masayuki Moroi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 112 days.

(21) Appl. No.: 15/367,096

(22) Filed: Dec. 1, 2016

(65) Prior Publication Data
US 2017/0159175 A1    Jun. 8, 2017

(30) Foreign Application Priority Data

Dec. 2, 2015    (JP) ................. 2015-235846

(51) Int. Cl.
*C23C 16/52*    (2006.01)
*C23C 16/448*    (2006.01)

(52) U.S. Cl.
CPC .......... *C23C 16/52* (2013.01); *C23C 16/4481* (2013.01)

(58) Field of Classification Search
None
See application file for complete search history.

(56) References Cited

U.S. PATENT DOCUMENTS

| | | | |
|---|---|---|---|
| 2004/0007180 A1* | 1/2004 | Yamasaki | C23C 16/16 118/715 |
| 2005/0095859 A1* | 5/2005 | Chen | C23C 16/4481 438/689 |
| 2008/0141937 A1* | 6/2008 | Clark | C23C 16/16 118/697 |
| 2013/0019960 A1* | 1/2013 | Choi | C23C 16/4408 137/334 |
| 2014/0124064 A1* | 5/2014 | Hidaka | C23C 16/4481 137/511 |

FOREIGN PATENT DOCUMENTS

| | | | |
|---|---|---|---|
| JP | 2006222133 A | * | 8/2006 |
| JP | 2012-234860 | | 11/2012 |
| KR | 10-2014-0118893 A | | 10/2014 |
| KR | 10-2015-0058040 A | | 5/2015 |

OTHER PUBLICATIONS

Machine Translation of JP-2006222133-A.*

* cited by examiner

*Primary Examiner* — David P Turocy
(74) *Attorney, Agent, or Firm* — Fenwick & West LLP (57) ABSTRACT

In a raw material gas supply apparatus, a remaining amount of the raw material is calculated by subtracting, from an amount of the raw material filled in a new raw material, a cumulative consumption amount including a consumption amount of the raw material calculated based on an actual flow rate of the raw material gas obtained from an offset value, (m3−(m1+m2)), m1, m2 and m3 being respective measurement values of first and second mass controller, and a mass flow meter, obtained by supplying a carrier gas and a dilution gas in a state where the carrier gas flows through a bypass channel, and an actual flow rate measurement value of the raw material obtained by subtracting the offset value from a value of (m3−(m1+m2)) obtained by supplying the carrier gas and dilution gas in a state where the carrier gas flows through the inside of a raw material container.

4 Claims, 6 Drawing Sheets

RAW MATERIAL GAS SUPPLY APPARATUS, RAW MATERIAL GAS SUPPLY METHOD AND STORAGE MEDIUM

CROSS-REFERENCE TO RELATED APPLICATIONS

This application claims priority to Japanese Patent Application No. 2015-235846 filed on Dec. 2, 2015, the entire contents of which is incorporated herein by reference.

FIELD OF THE INVENTION

The disclosure relates to a technique for supplying a sublimated raw material obtained by sublimating a solid raw material or a liquid raw material in a raw material container together with a carrier gas to a film forming unit.

BACKGROUND OF THE INVENTION

A film forming process, one of the semiconductor manufacturing processes, is performed by ALD (Atomic Layer Deposition) in which a raw material gas and a reactant gas for oxidizing, nitriding or reducing the raw material gas are alternately supplied, CVD (Chemical Vapor Deposition) in which a raw material gas is decomposed in a vapor phase or made to react with a reactant gas, or the like. As for the raw material gas used in the film forming process, a sublimated gas of the raw material is used in order to extremely reduce the amount of impurities introduced into a substrate and increase a density of crystal after film formation. For example, the raw material gas is used for a film forming apparatus for forming a high dielectric film by ALD.

Recently, along with the trend toward miniaturization of a wiring pattern formed on a semiconductor wafer (hereinafter, referred to as "wafer"), there is required a method capable of stabilizing a film thickness or a film quality and stabilizing a flow rate of a raw material. In supplying the raw material vaporized in a raw material container together with a carrier gas to a film forming unit, the amount of the vaporized raw material is changed depending on the filling amount of the raw material in the raw material container and, thus, the flow rate of the raw material is changed. Therefore, it is required to accurately check the remaining amount of the raw material in the raw material container and stabilize the supply amount of the raw material.

The replacement of the raw material container requires a long period of time. Thus, it is preferable to replace the raw material container to avoid emptying the raw material container during processing of wafers of a lot. For example, it is preferable to replace the raw material container during maintenance of a film forming apparatus. In order to prevent the operation stop of the film forming apparatus during the processing of the wafers of the lot, the raw material container needs to be replaced before the raw material container becomes empty. When it is difficult to check the accurate remaining amount of the raw material in the raw material container, a large margin is required and, thus, a large amount of the raw material is wasted during the replacement of the raw material container.

There is known a method for performing measurement by using a load cell or the like without separating the raw material container from the apparatus when measuring the remaining amount of the raw material in the raw material container. However, in the case of using as a raw material gas a gas obtained by sublimating a solid raw material, the raw material gas is easily resolidified when a temperature decreases and, thus, a line or the raw material container needs to be heated by a heating unit. Accordingly, the raw material container is fixed to a raw material gas supply unit, which makes it difficult to employ the method for measuring a weight by using a load cell.

Japanese Patent Application Publication No. 2012-234860 discloses a technique in which, with respect to a liquid raw material, a flow rate of a carrier gas supplied to a raw material container is adjusted to control a pressure in the raw material container and control a concentration of a raw material in a raw material gas to a constant level, and the amount of the raw material taken out of the raw material container is measured based on the concentration of the raw material in the raw material gas and a total flow rate of the raw material gas flowing through a raw material gas supply line. At this time, the amount of the raw material is calculated from the total flow rate of the raw material gas flowing through the raw material gas supply line and the flow rate of the carrier gas. However, there are variations between a flow rate controller for controlling the total flow rate and a flow rate controller for controlling the flow rate of the carrier gas. Therefore, when the remaining amount of the raw material is measured by adding the amount of the raw material taken out of the raw material container, the difference in the measurement values which is caused by individual variations between the devices becomes a problem.

SUMMARY OF THE INVENTION

In view of the above, the disclosure provides a technique capable of measuring the remaining amount of the raw material in the raw material container with high accuracy in supplying the raw material gas containing a gas obtained by vaporizing a solid or liquid raw material in the raw material container to the film forming unit.

In accordance with an aspect, there is provided a raw material gas supply apparatus for supplying a raw material gas obtained by vaporizing a solid or liquid raw material in a raw material container along with a carrier gas to a film forming unit for performing a film forming process on a substrate through a raw material gas supply line, the apparatus including:

a carrier gas supply line for supplying a carrier gas to the raw material container;

a bypass channel branched from the carrier gas supply line and connected to the raw material gas supply line while bypassing the raw material container;

a dilution gas supply line connected to the raw material gas supply line at a downstream side of a connection portion to which the bypass channel is connected, the dilution gas supply line serving to allow a dilution gas to join with the raw material gas;

a first mass flow controller and a second mass flow controller connected to the carrier gas supply line and the dilution gas supply line, respectively;

a mass flow meter provided in the raw material gas supply line at a downstream side of a joining portion to which the dilution gas supply line is connected;

a switching mechanism configured to selectively allow the carrier gas to flow through an inside of the raw material container or through the bypass channel; and a control unit configured to execute:

a raw material supply step of supplying the raw material gas together with the carrier gas and the dilution gas to the substrate in the film forming unit in a state where the carrier gas flows through the inside of the raw material container; and a remaining amount calculation step of calculating a remaining amount of the raw material by subtracting, from an amount of the raw material filled in a new raw material, a cumulative consumption amount including a consumption amount of the raw material which is calculated based on an actual flow rate of the raw material gas in the raw material supply step, wherein the actual flow rate of the raw material gas is obtained by executing:

a first step of obtaining an offset value that is a value of (m3−(m1+m2)), m1, m2 and m3 being respective measurement values of the first mass controller, the second mass flow controller and the mass flow meter, by supplying the carrier gas and the dilution gas in a state where the carrier gas flows through the bypass channel; and a second step of obtaining an actual measurement value of a flow rate of the raw material by subtracting the offset value from a value of (m3−(m1+m2)) obtained by supplying the carrier gas and dilution gas in a state where the carrier gas flows through the inside of the raw material container.

In accordance with another aspect, there is provided a raw material gas supply method for supplying a raw material gas obtained by vaporizing a solid or liquid raw material in a raw material container along with a carrier gas to a film forming unit for forming a film on a substrate by using a raw material gas supply apparatus including: a carrier gas supply line for supplying a carrier gas to the raw material container; a bypass channel branched from the carrier gas supply line and connected to the raw material gas supply line while bypassing the raw material container; a dilution gas supply line connected to the raw material gas supply line at a downstream side of a connection portion to which the bypass channel is connected, the dilution gas supply line serving to allow a dilution gas to join with the raw material gas; a first mass flow controller and a second mass flow controller connected to the carrier gas supply line and the dilution gas supply line, respectively; a mass flow meter provided in the raw material gas supply line at a downstream side of a joining portion to which the dilution gas supply line is connected; and a switching mechanism configured to selectively allow a carrier gas to flow through an inside of the raw material container or through the bypass channel, the method including:

supplying the raw material gas together with the carrier gas and the dilution gas to the substrate in the film forming unit in a state where the carrier gas flows through the inside of the raw material container; and calculating a remaining amount of the raw material in the raw material container by subtracting, from an amount of the raw material filled in a new raw material container, a cumulative consumption amount including a consumption amount of the raw material which is calculated based on an actual flow rate of the raw material in said supplying the raw material gas to the substrate in the film forming unit, wherein the actual flow rate is obtained by executing:

obtaining an offset value that is a value of (m3−(m1+m2)), m1, m2 and m3 being respective measurement values of the first mass controller, the second mass flow controller and the mass flow meter, by supplying the carrier gas and the dilution gas in a state where the carrier gas flows through the bypass channel; and obtaining an actual measurement value of a flow rate of the raw material by subtracting the offset value from a value of (m3−(m1+m2)) obtained by supplying the carrier gas and dilution gas in a state where the carrier gas flows through the inside of the raw material container.

In accordance with still another aspect, there is provided a storage medium storing a computer program used for a raw material gas supply apparatus for vaporizing a solid or liquid raw material in a raw material container and supplying the vaporized raw material, as a raw material gas, along with a carrier gas to a substrate through a raw material gas supply line, wherein: the computer program comprises a group of steps for performing the raw material gas supply method described above.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
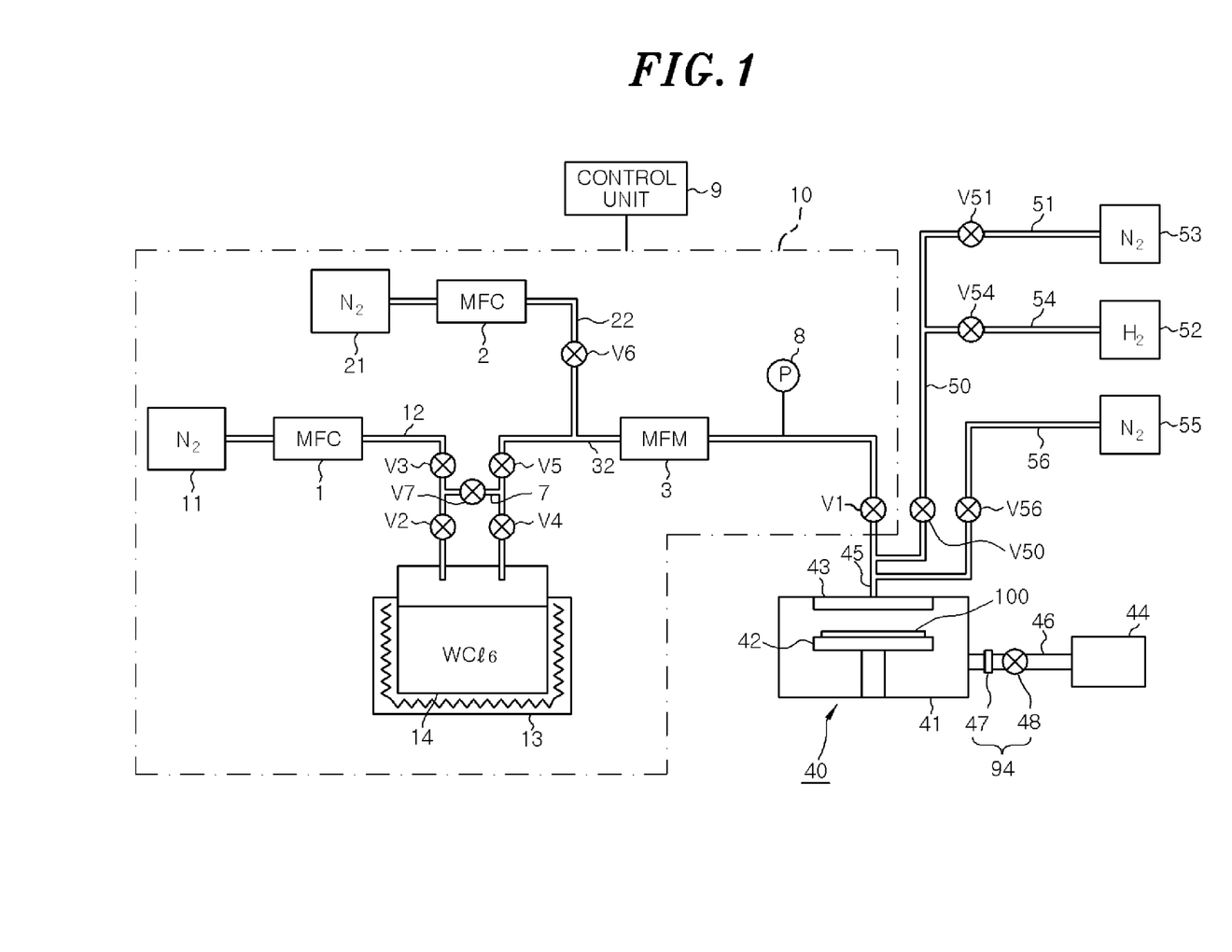
FIG. 1 shows an overall configuration of a film forming apparatus to which a raw material gas supply apparatus is applied.

Hereinafter, an exemplary configuration in which a raw material gas supply apparatus of the present disclosure is applied to a film forming apparatus will be described. As shown in FIG. 1, a film forming apparatus includes: a film forming unit 40 for forming a film on a wafer 100 as a substrate by using an ALD method; and a raw material gas supply unit 10 including a raw material gas supply device for supplying a raw material gas to the film forming unit 40. In this specification, it is assumed that a gas including a carrier gas and a (sublimated) raw material flowing along with the carrier gas is referred to as a raw material gas.

A raw material gas supply unit 10 includes a raw material container 14 accommodating a liquid or solid raw material, e.g., $WCl_6$ in a solid state. The raw material container 14 contains $WCl_6$ in a solid state at a room temperature. The raw material container 14 is covered by a jacket-shaped heating unit 13 having a resistance heating element. The raw material container 14 is configured to control a temperature in the raw material container 14 by increasing/decreasing the amount of power supplied from a power supply (not shown) based on a temperature of a gas phase part in the raw material container 14 which is detected by a temperature detector (not shown). A temperature of the heating unit 13 is set to a level, e.g., 160° C., at which the solid raw material is sublimated and $WCl_6$ is not decomposed.

Inserted into the gas phase part above the solid raw material in the raw material container 14 are, for example, a downstream end portion of a carrier gas supply line 12 and an upstream end portion of a raw material gas supply line 32. A carrier gas supply source 11 for supplying a carrier gas, e.g., $N_2$ gas, is provided at the upstream end of the carrier gas supply line 12. A first mass flow controller (MFC) 1, a valve V3, and a valve V2 are installed in the carrier gas supply line 12 in that order from the upstream side.

A valve V4, a valve V5, a mass flow meter (MFM) 3 that is a flow rate measuring unit, and a valve V1 are installed in the raw material gas supply line 32 in that order from the upstream side. Reference numeral 8 in the drawing denotes a pressure gauge for measuring a pressure of a gas supplied from the raw material gas supply line 32. A downstream end portion of the raw material gas supply line 32 is referred to as a gas supply line 45 because a reactant gas or a replacement gas to be described later flows therein. A downstream end of the dilution gas supply line 22 for supplying a dilution gas joins with the upstream side of the MFM 3 in the raw material gas supply line 32. A dilution gas supply source 21 for supplying a dilution gas, e.g., $N_2$ gas, is provided at an upstream end of the dilution gas supply line 22. A second mass flow controller (MFC) 2 and a valve V6 are installed in the dilution gas supply line 22 in that order from the upstream side. A portion between the valves V2 and V3 in the carrier gas supply line 12 and a portion between the valves V4 and V5 in the raw material gas supply line 32 are connected by a bypass channel 7 having a valve V7. The valves V2, V4 and V7 correspond to a switching mechanism. The carrier gas supply line 12, the raw material gas supply line 32, the bypass channel 7, and the valves V2 to V5 and V7 are covered by a jacket-shaped mantle heater having, e.g., a resistance heater.

Next, the film forming unit 40 will be described. The film forming unit 40 includes a mounting table 42 for horizontally supporting a wafer W in, e.g., a vacuum chamber 41, and a gas inlet 43 for introducing a raw material gas or the like into the vacuum chamber 41. The mounting table 42 has a heater (not shown). A gas supply line 45 is connected to the gas inlet 43. A gas from the raw material gas supply unit 10 is supplied into the vacuum chamber 41 through the gas inlet. A vacuum exhaust unit 44 is connected to the vacuum chamber 41 via a gas exhaust line 46. Pressure control valves 47 and 48 constituting a pressure controller 94 for controlling a pressure in the film forming unit 40 are provided in the gas exhaust line 46.

The gas supply line 45 joins with a reactant gas supply line 50 for supplying a reactant gas that reacts with a raw material gas and a replacement gas supply line 56 for supplying a replacement gas. The other end of the reactant gas supply line 50 is branched into an $H_2$ gas supply line 54 connected to a reactant gas supply source 52 for supplying a reactant gas, e.g., $H_2$ gas, and an inert gas supply line 51 connected to an inert gas supply source 53 for supplying an inert gas, e.g., $N_2$ gas. The other end of the replacement gas supply line 56 is connected to a replacement gas supply source 55 for supplying a replacement gas, e.g., $N_2$ gas. Notations V50, V51, V54 and V56 in the drawing denote valves installed in the reactant gas supply line 50, the inert gas supply line 51, the $H_2$ gas supply line 54, and the replacement gas supply line 56, respectively.

As will be described alter, when a W (tungsten) film is formed by the film forming unit 40, a raw material gas containing $WCl_6$ and $H_2$ gas as a reactant gas are alternately supplied and a replacement gas for replacing an atmosphere in the vacuum chamber 41 is supplied between the supply of the raw material gas and the reactant gas. The raw material gas is intermittently supplied to the film forming unit 40 while alternately repeating a supply period and a pause period. The supply of the raw material gas is controlled by controlling on/off of the valve V1. The valve V1 is configured to be opened/closed by a control unit 9 to be described later. "ON" indicates an open state of the valve V1. "OFF" indicates a closed state of the valve V1.

Figure 2:
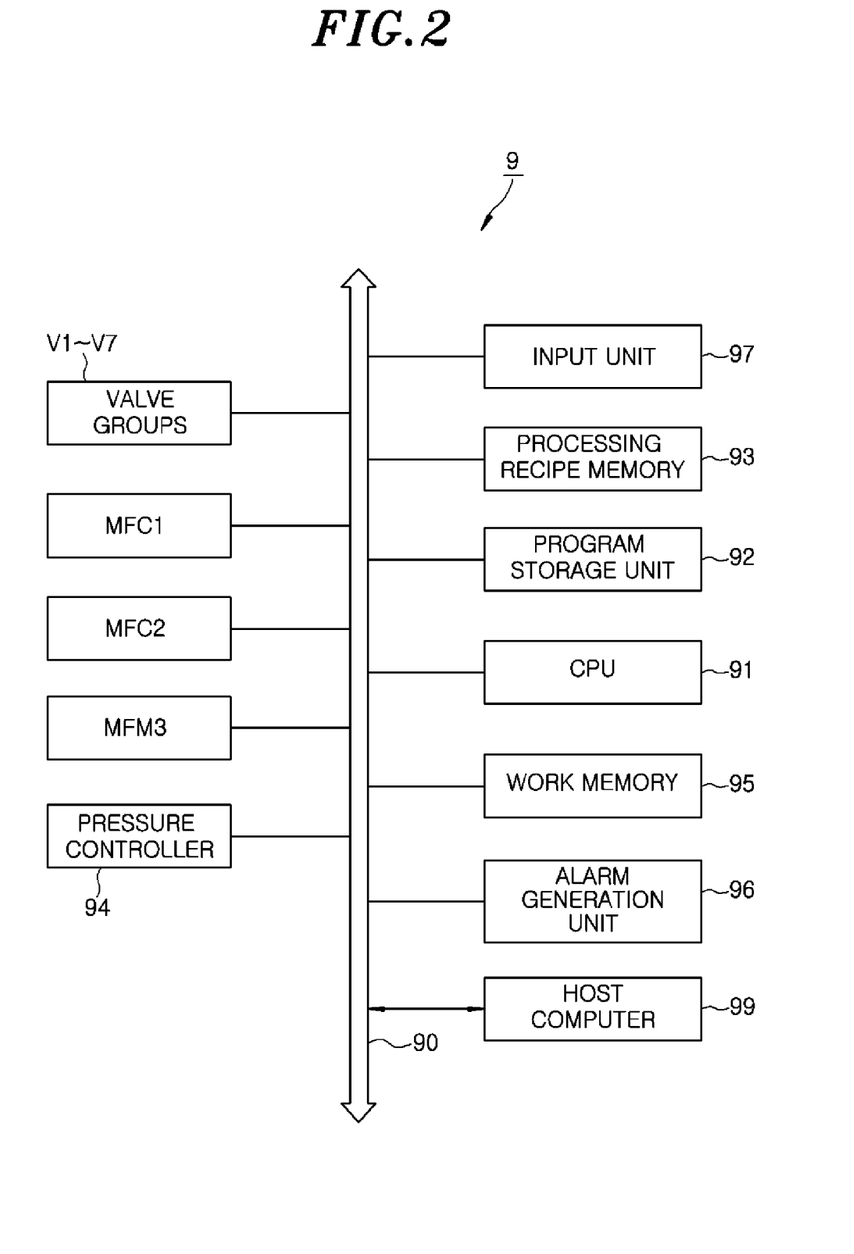
FIG. 2 shows a configuration of a controller of a raw material gas supply unit according to an embodiment.

The raw material gas supply unit 10 includes the control unit 9. As shown in FIG. 2, the control unit 9 includes a CPU 91, a program storage unit 92, and a memory 93. Reference numeral 90 in the drawing denotes a bus. The control unit 9 is connected to a pressure controller 94 connected to the valve groups V1 to V7, the MFC 1, the MFC 2, the MFM 3, and the film forming unit 40. The control unit 9 is also connected to a host computer 99. A film forming recipe of a lot of the wafer 100 to be loaded into the film forming apparatus is transmitted from the host computer 99 and stored in the memory 93. The control unit 9 includes a work memory 95 in which the remaining amount of the raw material in the raw material container 14 is stored. The control unit 9 further includes an input unit 97 through which an amount of the raw material filled in the raw material container 14 that is reported by, e.g., a maker, is stored in the work memory 95 upon the replacement of the raw material container 14 as will be described later. The control unit 9 is connected to an alarm generation unit 96. The control unit 9 is also connected to an output unit such as a monitor or the like. The monitor is configured to display thereon the remaining amount of the raw material which is stored in the work memory 95, the activation/non-activation of the alarm, and the like.

The processing recipe is information on a processing condition and a sequence of film formation of the wafer 100 which is set for each lot. The processing condition includes a process pressure, timing of supplying a gas to the film forming unit 40 and timing of stopping the supply in the ALD method, a raw material gas flow rate, and the like. Hereinafter, the ALD method will be briefly described. First, $WCl_6$ gas as a raw material gas is supplied for, e.g., one second and then the valve V1 is closed to allow $WCl_6$ gas to be adsorbed onto the surface of the wafer 100. Next, a replacement gas ($N_2$ gas) is supplied into the vacuum chamber to replace the atmosphere in the vacuum chamber 41. Thereafter, a reactant gas ($H_2$ gas) is supplied together with a dilution gas ($N_2$ gas) into the vacuum chamber 41. As a consequence, a W (tungsten) film of an atomic layer is formed on the surface of the wafer 100 by hydrolysis and dechlorination reaction. Then, the replacement gas is supplied into the vacuum chamber 41 to replace an atmosphere in the vacuum chamber 41. Accordingly, a cycle of sequentially supplying the raw material gas containing $WCl_6$, the replacement gas, the reactant gas and the replacement gas into the vacuum chamber 41 is repeated multiple times. As a result, a W film is formed.

In the ALD method, the cycle of sequentially supplying the raw material gas, the replacement gas, the reactant gas, and the replacement gas is repeated multiple times. Therefore, the timing of an ON signal and the timing of an OFF signal are determined by the recipe that specifies such a cycle. For example, the supply and the supply stop of the raw material gas are performed by the valve V1. Accordingly, a period from the ON signal to the OFF signal of the valve V1 corresponds to a raw material gas supply period and a period from the OFF signal to the ON signal of the valve V1 corresponds to a period in which the raw material gas supply is stopped. When the ALD method is used for obtaining measured flow rates of the raw material in the MFCs 1 and 2 and the MFM 3, the measured flow rates may be unstable due to the intermittent supply of the raw material gas for a short supply period. To that end, in this example, a value obtained by dividing an integration value of the measurement values of the MFCs 1 and 2 and the MFM 3 in one cycle of ON and OFF of the valve V1 by the time period of one cycle is used (evaluated) as a measurement output value (measured value), as will be described in detail later.

The program stored in the program storage unit 92 has a group of steps for executing the operation of the raw material gas supply unit 10 and a group of steps for executing the operation of monitoring the remaining amount in the raw material container 14. The term "program" includes software such as a process recipe or the like. The group of steps for executing the operation of monitoring the remaining amount in the raw material container 14 includes a step of integrating measurement outputs of the flow rates of the MFCs 1 and 2 and the MFM 3 in the supply period and performing an operation using the integration value as the flow rate in the supply period. The integration process may be performed by a hard configuration using a time constant circuit. The program is stored in a storage medium, e.g., a hard disk, a compact disk, a magnet optical disk, a memory card, or the like and installed in a computer.

Figure 3A:
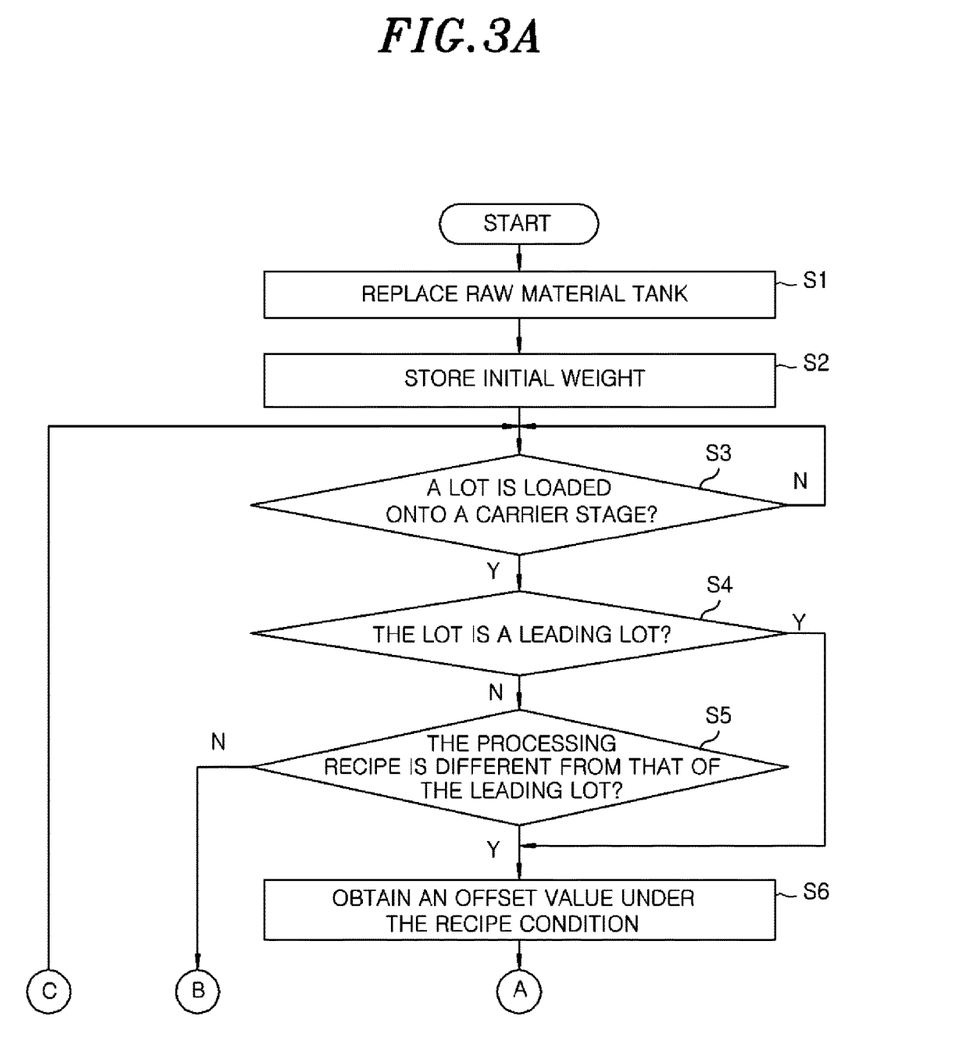
FIGS. 3A and 3B are a flowchart showing a process of measuring a remaining amount of a raw material in the raw material gas supply unit.
Figure 3B:
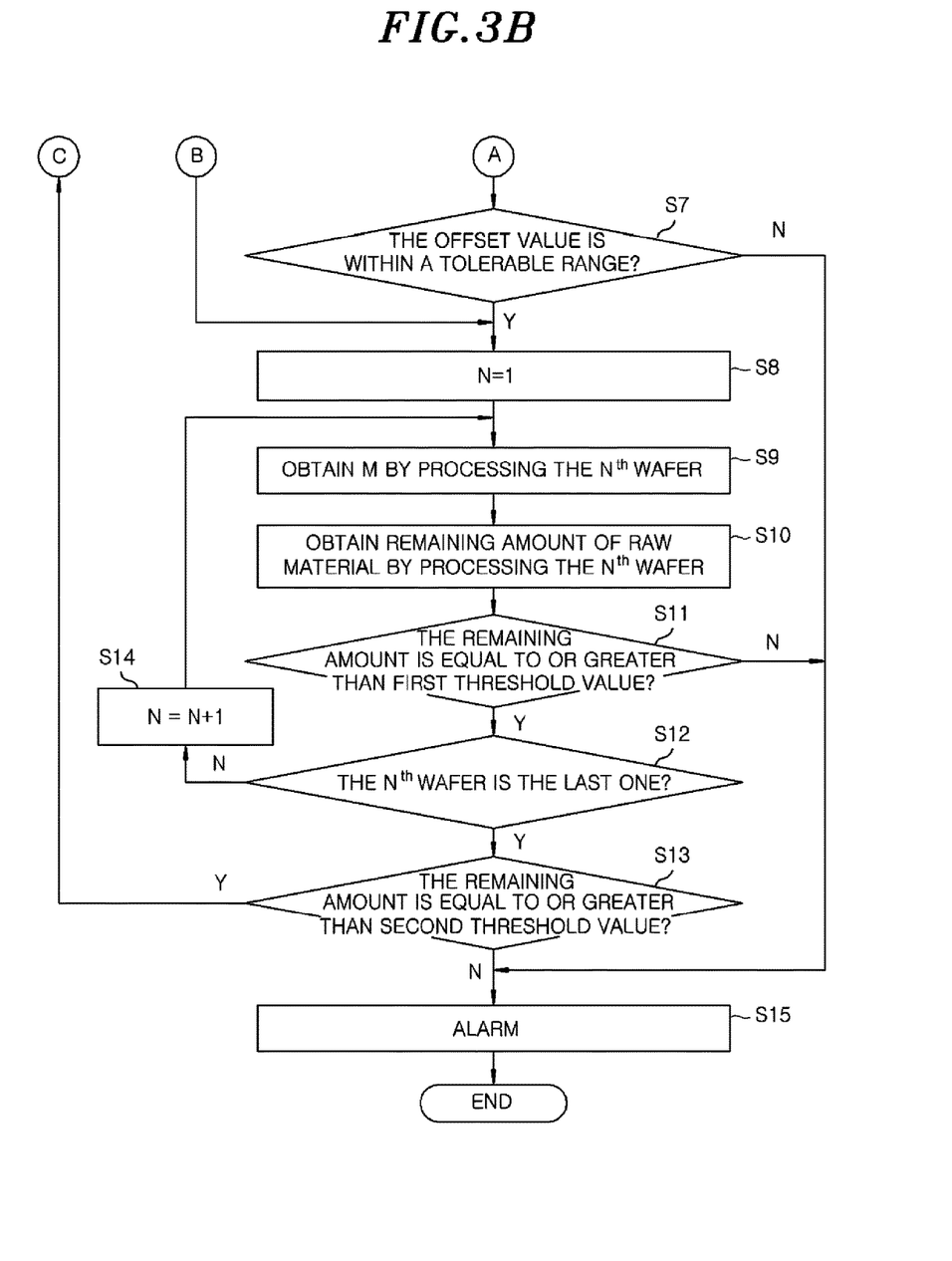

The operation of the film forming apparatus according to the embodiment will be described with reference to the flowchart shown in FIGS. 3A and 3B. In a step S1, the raw material container 14 is replaced with a new raw material container 14 filled with a raw material. The new raw material container 14 is connected to the carrier gas supply line 12 and the raw material gas supply line 32. Then, an operator stores the filling amount (initial weight) in the new raw material container 14 as an initial value $R_0$ of the remaining amount of the raw material in the memory 93 through the input unit 97 (step S2). As for the filling amount of the new raw material container 14, a value reported by a maker of the raw material is used, for example. The new raw material container 14 indicates a raw material container 14 that has been subjected to filling of the raw material and includes a raw material container 14 in which the raw material is refilled.

Next, a carrier accommodating, e.g., 25 wafers 100, of a leading lot is loaded onto a carrier stage. In this case, the steps 3, 4 and 6 are sequentially executed to obtain an offset value under the condition of the processing recipe of the leading lot.

Figure 4:
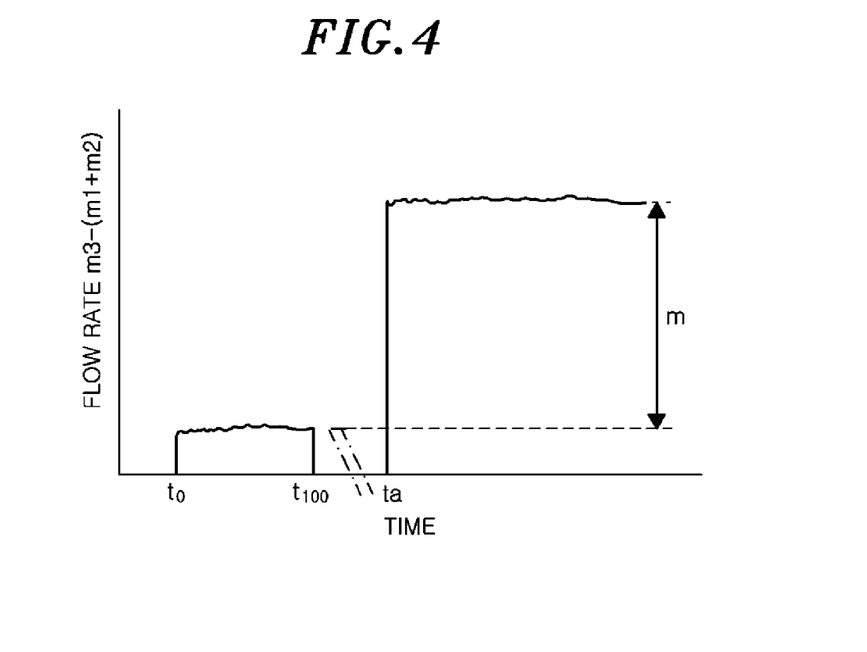
FIG. 4 is a characteristic diagram showing a difference between a measurement value of a mass flow meter (MFM) and a total set value of a first and a second mass flow controller (MFC)

Hereinafter, the offset value will be described. FIG. 4 shows a difference between a sum (m1+m2) of the measurement value m1 of the MFC 1 and the measurement value m2 of the MFC 2 and a measurement value m3 of the MFM 3 in the case of supplying a carrier gas and a dilution gas respectively from the carrier gas supply source 11 and the dilution gas supply source 21 by using the raw material gas supply unit 10 to the film forming unit 40 through the MFM 3. The difference (m3−(m1+m2)) obtained during a period from time $t_0$ to $t_{100}$ indicates a value obtained in the case of supplying the carrier gas to the raw material gas supply line 32 through the bypass channel 7 without passing through the raw material container 14.

During the period from the time $t_0$ to the time $t_{100}$, the gas flowing through the MFM 3 is combination of the carrier gas supplied from the carrier gas supply line 12 and the dilution gas supplied from the dilution gas supply line 22. However, the difference between the measurement value m3 of the MFM 3 and the sum (m1+m2) of the measurement value m1 of the MFC 1 and the measurement value m2 of the MFC 2 is not zero as shown in FIG. 4. Such a difference caused by individual differences among the MFM 3, the MFC 1, and the MFC 2 corresponds to an offset value.

Next, the process of obtaining the offset value will be described. The offset value is obtained by setting the set values of the MFCs 1 and 2 to the respective flow rates of the carrier gas and the dilution gas which are determined based on the target value of the raw material gas flow rate stored in the processing recipe. The timing of opening/closing the valve V1 is set to be the same as that in the cycle of supplying the raw material gas to the film forming unit 40 and stopping the supply in the processing recipe. A pressure in the process of obtaining the offset value is set to a level determined by the processing recipe. The control of the temperature of the film forming unit 40 requires time and the vaporized raw material may be adhered to a low-temperature portion and solidified. Therefore, the temperature of the film forming unit 40 is set in advance to a film forming temperature, e.g., 170° C.

The set value of the MFC 1 is determined based on the flow rate of the carrier gas which enables the raw material to be supplied at a target flow rate in a state where the raw material container 14 containing intact raw material is used. The relationship between the increase/decrease in the flow rate of the raw material and the increase/decrease in the flow rate of the carrier gas is stored in, e.g., the memory 93. The pressure in the film forming unit 40 is set to a set pressure in the processing recipe by the pressure controller 94.

When the flow rate of the raw material is small and the total flow rate of the raw material gas diluted by the dilution gas is determined as the total flow rate of the carrier gas and the dilution gas, a set value of the flow rate of the dilution gas is obtained by subtracting the set value of the flow rate of the carrier gas from the total flow rate. When the flow rate of the raw material is included in the total flow rate, the target value of the supply amount of the raw material is considered as, e.g., a weight per unit time. Therefore, the total flow rate and the flow rate of the carrier gas for supplying the raw material are obtained based on the target value of the supply amount of the raw material and the processing pressure. Accordingly, the set value of the flow rate of the dilution gas is obtained by subtracting the sum of the supply amount of the raw material and the flow rate of the carrier gas from the total flow rate.

Next, the valves V3, V5, V6 and V7 are opened and the valve V1 is opened/closed at the same timing as opening/closing timing of the valve V1 in the processing recipe after the time $t_0$. In this case, an operation of opening the valve V1 for one second and closing the valve V1 for one second is repeated 100 times from time $t_0$ to $t_{100}$. The vacuum chamber 41 has already been vacuum-evacuated. Accordingly, the carrier gas flows at a flow rate corresponding to the set value of the MFC 1 from the carrier gas supply source 11 to the raw material gas supply line 32 through the carrier gas supply line 12 and the bypass channel 7. In the raw material gas supply line 32, the carrier gas is mixed with the dilution gas supplied from the dilution gas supply line 22, and the raw material gas diluted with the dilution gas flows through the MFM 3. The gaseous mixture of the carrier gas and the dilution gas is intermittently supplied to the film forming unit 40.

Figure 5:
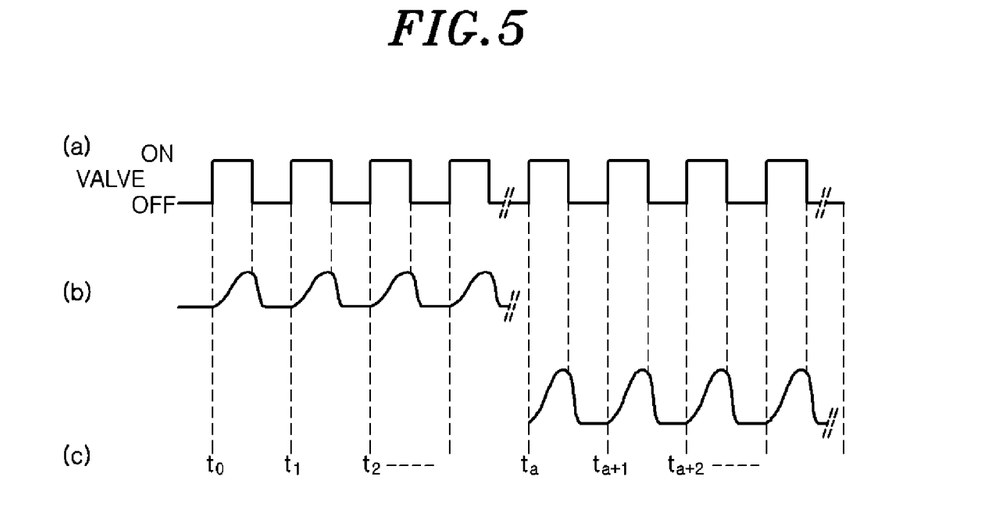
FIG. 5 depicts time charts showing opening/closing of a valve and temporal changes in a flow rate of a raw material supplied from the raw material supply unit.

The measurement values of the flow rates in the MFCs 1 and 2 and the MFM 3 during the period from the time $t_0$ to the time $t_{100}$ are obtained. In FIG. 5, (a) shows a state of the valve V1 for supplying the raw material gas and blocking the supply of the raw material gas. The ON period corresponds to the raw material gas supply period. The OFF period corresponds to a period in which the raw material gas supply is stopped. In FIG. 5, (b) shows variation of a measurement output (measured value) of the flow rate of the raw material gas which is measured by the MFM 3 during the period from the time $t_0$ to the time $t_{100}$. Since the opening period of the valve V1 is short, the measurement output of the flow rate of the raw material gas which is measured by the MFM 3 abruptly increases after the ON instruction of the valve V1 and abruptly decreases after the OFF instruction of the valve V1. A ratio of the supply period and the supply-stop period in (a) of FIG. 5 is merely an example for convenience of illustration.

Therefore, the measurement value of the flow rate is obtained by dividing, by a time period T of one cycle of supplying the raw material gas and stopping the supply, an integration value obtained by integrating the measured outputs of the flow rates of the MFM 3 and the MFCs 1 and 2 during one cycle by the control unit 9. In this case, based on the ON instruction of the valve V1 shown in (a) of FIG. 5, the integration operation of the gas flow rate is started at the time $t_0$ and completed at the time $t_1$ at which the next ON instruction of the valve V1 is outputted. The period from the time $t_0$ to the time $t_1$ is set to one cycle.

Further, values (integration value/$(t_1-t_0)$) obtained by dividing the integration value of the flow rates in the MFCs 1 and 2 and the MFM 3 from the time $t_0$ to the time $t_1$ by the time period T of one cycle, i.e., the period $(t_1-t_0)$ from the time $t_0$ to the time $t_1$, are respectively set to the measurement values m1, m2 and m3 of the MFC 1, the MFC 2 and the MFM 3 from the time $t_0$ to the time $t_1$.

Figure 6:
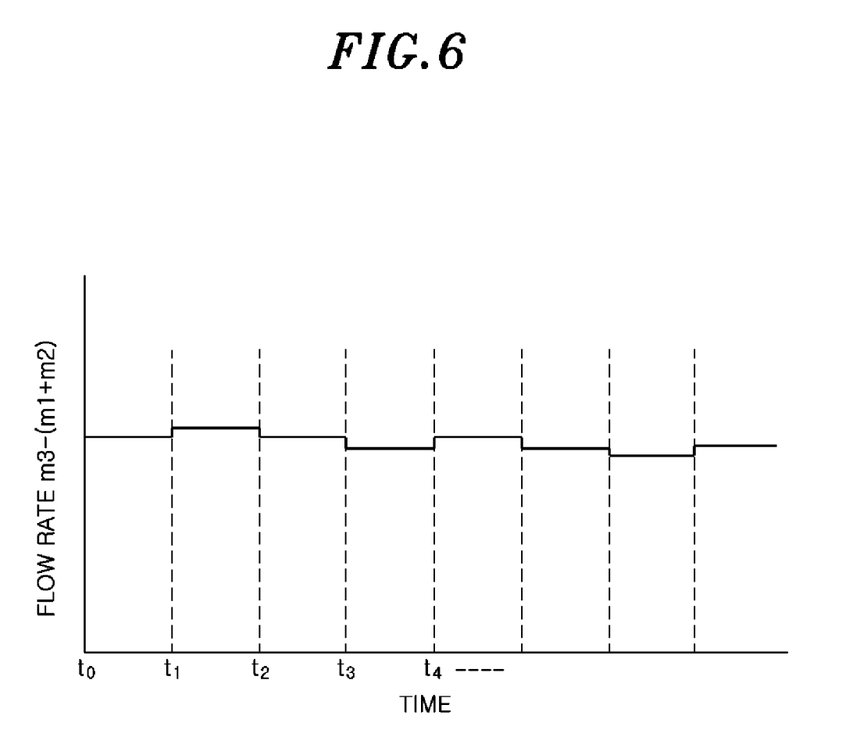
FIG. 6 is a characteristics diagram showing an example of a measurement value of MFM.

The values of m1 to m3 in the respective cycles from time $t_0$ to time $t_1$, from time $t_1$ to time $t_2$ . . . are obtained and the value of (m3−(m1+m2)) in each cycle is obtained as shown in FIG. 6. The average of the values of (m3−(m1+m2)) during 100 cycles from the time $t_0$ is set to the offset value.

Referring back to FIGS. 3A and 3B, when the offset value obtained in the step S6 is within a tolerable range, "YES" is selected in a step S7 and the process proceeds to a step S8. In the step S8, N is set to 1. Then, in a step S9, the first wafer 100 is loaded into the film forming unit 40 and processed.

In the step S7, it is determined whether or not the offset value is within the tolerable range. As described above, the offset value indicates the difference caused by the difference in the measurement outputs of the devices. When the offset value is too large, it is considered that there is a reason other than the individual differences between the MFM 3, and the MFM 1 and the MFC 2. Therefore, when the offset value is not within the tolerable range, "NO" is selected in the step S7 and the process proceeds to a step S15. In the step S15, an alarm is activated by the alarm generation unit 96. Then, the process is completed and maintenance is performed.

Since the heating unit 13 of the raw material container 14 is switched on in advance, the raw material container 14 is heated to, e.g., 160° C. Accordingly, the solid raw material is sublimated and the concentration of the raw material in the raw material container 14 is increased to a level close to a saturated concentration. Then, the wafer 100 is loaded into the film forming unit 40 and processed based on the processing recipe, and the actual measurement value m of the flow rate of the raw material which will be described later is obtained. In other words, the flow rate of the carrier gas and the flow rate of the dilution gas are set to levels stored in the processing recipe and the pressure of the film forming unit 40 is set to a level determined by the processing recipe. At time $t_a$, the valve V7 is closed and the valves V2 and V4 are opened. Accordingly, the carrier gas is supplied at a flow rate set by the MFC 1 through the carrier gas supply line 12 into the raw material container 14 and the raw material vaporized in the raw material container 14 flows together with the carrier gas to the raw material gas supply line 32. Also, the dilution gas flowing through the dilution gas supply line 22 to the raw material gas supply line 32 joins therewith. After the time $t_a$, the valve V1 is opened/closed at the same timing as the opening/closing timing of the valve V1 in the processing recipe. In this example, the operation of opening the valve V1 for one second and closing the valve V1 for one second is repeated. Thus, the raw material gas mixed with the dilution gas is sent to the film forming unit 40. Accordingly, the carrier gas is supplied to the raw material container 14 and the raw material gas is supplied to the film forming unit 40 while setting the flow rate of the carrier gas, the flow rate of the dilution gas, the pressure of the film forming unit 40 and the interval of opening/closing the valve V1 to those in the process of obtaining the offset value.

As a consequence, as shown in (c) of FIG. 5, the measurement value of the raw material gas abruptly increases after the ON instruction of the valve V1 up to a level higher than the measurement value from the time $t_0$ to the time $t_{100}$ and immediately decreases after the OFF instruction of the valve V1.

In the processing of the first wafer 100, as in the period from the time $t_0$ to the time $t_{100}$, the integration values of the flow rates in the MFCs 1 and 2 and the MFM 3 from the time $t_a$ to the time $t_{a+1}$ are divided by the time period T of one cycle, i.e., the period $(t_{a+1}-t_a)$ from the time $t_a$ to the time $t_{a+1}$. The values thus obtained, i.e., (integration value/$(t_{a+1}-t_a)$), are respectively set to the measurement values m1, m2 and m3 of the MFCs 1 and 2 and the MFM 3 from the time $t_a$ to the time $t_{a+1}$. The value of (m3−(m1+m2)) in each cycle is obtained by subtracting the sum of the measurement value m1 of the MFC 1 and the measurement value m2 of the MFC 2 from the measurement value m3 of the MFM 3 in each cycle of the gas supply. The value of (m3−(m1+m2)) in each cycle after the time $t_a$ corresponds to the flow rate of the raw material obtained by subtracting the sum of the flow rate of the carrier gas and the flow rate of the dilution gas from the total flow rate of the raw material gas diluted by the dilution gas and supplied to the film forming unit 40, as shown in FIG. 4.

However, as described above, there is a difference between the measurement value of the MFM 3 and the sum of the measurement value m1 of the MFC 1 and the measurement value m2 of the MFC 2, which is caused by the difference in the measurement outputs of the MFM 3 and the MFCs 1 and 2. The value corresponding to the difference is the offset value. Therefore, an actual measurement value m of the flow rate (actual flow rate) of the raw material supplied to the film forming unit 40 is obtained by obtaining the average of the values (m3−(m1+m2)) in the respective cycles of the raw material gas supply after the time $t_a$ shown in FIG. 4 and (c) of FIG. 5 and then subtracting the offset value during the period from the time $t_0$ to the time $t_{100}$ from the average. The actual measurement value m is converted to a value of the raw material (mg/min) by the following Eq. (1).

Raw material (mg/min)=Flow rate (sccm) of Raw material×0.2(Conversion Factor)/22400×(Molecular weight (WCl$_6$:396.6) of Raw material 1)×1000Eq. (1)

In this case, the flow rate of the raw material is obtained by calculating the average of the total flow rate in one cycle of supplying the raw material gas and stopping the supply. Therefore, the raw material is supplied from the time $t_a$ at which the valve V1 is opened first in the processing of the first wafer 100 to a time at which the processing of the first wafer is completed and the valve V1 is closed. An actual measurement value M of the weight of the raw material supplied from the raw material container 14 is calculated by multiplying the raw material supply time by a value converted from the actual measurement value m of the flow rate of the raw material by the Eq. (1).

Next, in a step S10, the actual measurement value M of the weight of the raw material which is the consumption amount of the raw material is subtracted from the remaining amount of the raw material before the processing of the first wafer 100. Accordingly, the remaining amount of the raw material in the raw material container 14 after the completion of the first wafer 100 is obtained. In this example, this is the first film forming process performed after the setting of the new raw material container 14, so that the remaining amount of the raw material before the processing of the first wafer 100 is the aforementioned initial weight $R_0$. Then, in a step S11, it is determined whether or not the remaining amount of the raw material in the raw material container 14 is greater than or equal to a first threshold value. The first threshold value is set to the amount that prevents the raw material in the raw material container 14 from being empty during the processing of the wafer 100 in the case of continuously performing a film forming process on a single wafer 100. Therefore, the weight of the raw material which is required to process a single wafer 100 is measured in advance, and a margin is added to the measured weight of the raw material. The amount of the raw material which includes the margin is set to the first threshold value.

When the remaining amount of the raw material in the raw material container 14 is greater than or equal to the first threshold value, the process proceeds to a step S12. Since the first wafer 100 is not the last wafer 100, "NO" is selected. In a step S14, N is set to 2 and the process returns to the step S9. In the step S9, the second wafer 100 is subjected to a film forming process and the actual measurement value m of the flow rate of the raw material is obtained. Also, the actual measurement value M of the weight of the raw material supplied from the raw material container 14 is obtained. Next, in the step S10, the remaining amount of the raw material in the raw material container 14 after the completion of the film formation on the second wafer 100 is calculated by subtracting the weight (actual measurement value M) of the raw material consumed by performing the film forming process on the second wafer 100 from the remaining amount of the raw material in the raw material container 14 before the completion of the film formation on the second wafer 100.

By repeating the steps S9 to S12 and the step S14, all wafers 100 of the lot are sequentially processed. The remaining amount of the raw material in the raw material container 14 is calculated by subtracting the cumulative consumption amount (cumulative used amount) of the raw material consumed by performing the film forming process on the wafer 100 from the initial weight $R_0$ in the raw material container 14 for each film forming process performed on each wafer 100. In the case of the last wafer 100, i.e., the $25^{th}$ wafer in this example, "YES" is selected in the step S12 and the process proceeds to a step S13.

When the remaining amount of the raw material in the raw material container 14 during the processing of the wafer 100 of the lot is smaller than the first threshold value, "NO" is selected in the step S11 and the process proceeds to a step S15. In the step S15, an alarm is activated by the alarm generation unit 96, and the process is completed. As described above, the first threshold value is calculated based on the amount obtained by adding a margin to the weight of the raw material which is required to process a single wafer 100. Therefore, the raw material container 14 is replaced when the remaining amount of the raw material is smaller than the first threshold value, and the film forming process is performed in a state where the remaining amount of the raw material is not smaller than the first threshold value. Accordingly, it is possible to prevent exhaustion of the raw material during processing of a next wafer 100.

After the film formation on the last wafer 100 is completed and the processing of the current lot is completed, it is determined in the step S13 whether or not the remaining amount of the raw material in the raw material container 14 is greater than or equal to a second threshold value. The second threshold value is set to a remaining amount of the raw material which allows a maximum number (e.g., 25) of wafers 100 of a single lot to be processed. Therefore, the second threshold value is set to a value obtained by adding a margin to a value obtained by multiplying the weight of the raw material which is required to process a single wafer 100 by the maximum number of the wafers 100.

When the remaining amount of the raw material is greater than or equal to the second threshold value, the process returns to the step S3. When the subsequent lot is loaded onto the carrier stage, the step S3 and S4 are executed. Since the current lot is not the leading lot, "NO" is selected in the step S4 and the process proceeds to a step S5. In the step S5, it is determined whether or not the processing recipe for the wafer 100 of the current lot is different from the processing recipe for the wafer of the prior lot (previous lot). Specifically, it is determined whether the flow rate of the raw material (target value of the flow rate of the raw material) in the processing recipe, the set pressure of the film forming unit 40, and the cycle of supplying the raw material gas and stopping the supply in the film forming process are the same as those in the previous processing recipe. When any one of them is different, "YES" is selected and the process proceeds to the step S6. In the step S6, the target value of the flow rate of the raw material, the set pressure of the film forming unit 40, and the cycle of supplying the raw material gas and stopping the supply in the film forming process are set based on the processing recipe for the wafer 100 of the current lot (subsequent lot). The offset value is obtained as in the case of the previous lot and the step S7 and the subsequent steps are executed.

When the processing recipe in the subsequent lot, e.g., the flow rate of the raw material (target value of the flow rate of the raw material) in the processing recipe, the set pressure of the film forming unit 40, and the cycle of supplying the raw material gas and stopping the supply in the film forming process, is the same as the processing recipe in the prior lot (previous lot), "NO" is selected in the step S5 and the process proceeds to the step S8. The step S8 and subsequent steps are executed by using the offset value used in the previous lot.

In the processing of the subsequent lot, the remaining amount of the raw material after the processing of the last wafer 100 of the previous lot is stored in the memory 93. Therefore, the process proceeds to the step S8 and N is set to 1. In the step S9 and the subsequent processes, the remaining amount is calculated by sequentially subtracting the consumption amount of the raw material for a single wafer 100 from the remaining amount of the raw material after the processing of the last wafer 100 of the previous lot.

When the remaining amount of the raw material in the raw material container 14 is smaller than the second threshold value after the processing of the last wafer 100 of each lot, "NO" is selected in the step S13 and the process proceeds to the step S15. In the step S15, an alarm is activated by the alarm generation unit 96 and the process is completed. The second threshold value is calculated based on the amount obtained by adding the margin to the weight of the raw material which is required to process the maximum number of wafers 100 of a single lot. Therefore, the raw material container 14 is replaced while stopping the operation of the apparatus when the remaining amount of the raw material is smaller than the second threshold value, and the film forming process is performed in a state where the remaining amount of the raw material is not smaller than the second threshold value. Accordingly, it is possible to prevent exhaustion of the raw material during the processing of the subsequent lot.

When the remaining amount of the raw material is greater than or equal to the second threshold value, the wafer 100 of the next lot can be subjected to the film forming process. However, in the step S11, it is checked whether or not the remaining amount of the raw material is greater than or equal to the first threshold value in order to more reliably prevent exhaustion of the raw material during the processing of the wafer 100 which may be caused by a certain problem of an apparatus before completion of the processing of all wafers 100 of the lot.

For example, pre-coating for preparing a condition of the processing chamber 41 may be performed, after cleaning of the vacuum chamber 41 of the film forming apparatus, by forming a thin film on an inner wall of the film forming unit 40 by supplying a film forming gas to the vacuum chamber 41. In that case, the actual measurement value M of the weight of the raw material supplied to the film forming unit 40 to perform the pre-coating is calculated, and the consumption amount of the raw material in the pre-coating is added to the cumulative value of the actual measurement value M of the weight of the raw material which is subtracted from the initial weight $R_0$ of the raw material.

In the case of performing dummy processing in which the raw material is supplied to the film forming unit 40 where the wafer 100 is not loaded before the processing of the first wafer 100, the actual measurement value M of the raw material supplied to the film forming unit 40 is calculated and, then, the consumption amount of the raw material during the dummy processing is added to the cumulative value of the actual measurement value M of the weight of the raw material which is subtracted from the initial weight $R_0$ of the raw material.

In the above embodiment, in the case of supplying the carrier gas to the raw material container 14, discharging the vaporized raw material together with the carrier gas from the raw material container 14, diluting the vaporized raw material with the dilution gas, and supplying the vaporized raw material diluted with the dilution gas to the film forming unit 40, the actual measurement value of the flow rate of the raw material is obtained by subtracting the offset value corresponding to the individual variation of the respective measurement devices from the difference between the sum of the measurement values of the flow rates of the carrier gas and the dilution gas and the sum of the measurement values of the flow rates of the vaporized raw material, the carrier gas and the dilution gas. The remaining amount of the raw material in the raw material container 14 is calculated by obtaining the actual measurement value M of the weight of the supplied raw material from the actual measurement value of the flow rate of the raw material and the raw material supply time and then subtracting the actual measurement value M of the weight of the raw material from the amount of the raw material accommodated in the raw material container 14. Therefore, the individual variations between the respective measurement devices are cancelled out and the accurate remaining amount of the raw material can be obtained.

When the ALD method is performed, the integration value of the measurement output in one cycle of supplying the raw material gas and stopping the supply in each measurement device is considered as the measurement value of the flow rate. Therefore, the instability of the measurement caused by increase/decrease in the gas flow rate during a short period of time can be prevented. Accordingly, the measurement value of the gas flow rate can be stably obtained.

The measurement values m1 to m3 of the flow rates may be calculated by dividing, by a time period nT of n cycles, an integration value obtained by integrating measurement outputs of the flow rates of the MFM 3 and the MFCs 1 and 2 during n (n being 2 or more) cycles of supplying the raw material gas and stopping the supply by the control unit 9.

When there is a difference between the flow rate of the raw material and the target value of the raw material, it is possible to control the flow rate of the carrier gas and the supply amount of the raw material by using the flow rate of the raw material which is obtained in the step S9. When the difference between the flow rate of the raw material and the target value of the raw material is large, the process may be terminated by activating an alarm. The flow rate of the raw material which is obtained in the step S9 is a value obtained by considering the offset value. Therefore, the individual variations between the respective measurement devices are cancelled out and the accurate measurement value of the raw material can be obtained. By controlling the supply amount of the carrier gas based on the measurement value, the supply amount of the raw material for each wafer 100 can be stabilized.

For example, in the case of performing a film forming process by repeating 100 times a cycle of supplying the raw material and stopping the supply, there may be used a processing recipe in which the supply period of the raw material gas and the flow rate of the raw material in the first 50 cycles are different from the supply period of the raw material gas and the flow rate of the raw material in the second 50 cycles. In that case, the offset value in the first 50 cycles and the offset value in the second 50 cycles are obtained in the process of obtaining the offset value of the step S6.

When the actual measurement value M of the weight of the raw material supplied from the raw material container 14 is obtained in the step S9, the actual measurement value m of the flow rate of the raw material in the first 50 cycles is obtained by using the offset value in the first 50 cycles in the film forming process of each wafer 100. An actual measurement value M1 of the weight of the raw material in the first 50 cycles is obtained by multiplying the measurement value m by the raw material supply time in the first 50 cycles. Then, in the film forming process in the second 50 cycles, an actual measurement value M2 of the weight of the raw material in the second 50 cycles is obtained by using the offset value in the second 50 cycles. The actual measurement value M of the weight of the raw material supplied from the raw material container 14 can be obtained by adding the actual measurement value M1 of the weight of the raw material in the first 50 cycles and the actual measurement value M2 of the weight of the raw material in the second 50 cycles.

The present disclosure may be used for a film forming apparatus by using a CVD method. In the CVD method, a film is formed on the wafer 100 by continuously supplying a raw material gas to the film forming unit 40 and also by continuously supplying a reactant gas. In the CVD method, the measurement outputs of the flow rates of the MFM 3 and the MFCs 1 and 2 in a state where the flow rate of the raw material gas is stable may be respectively set to the measurement values m1 to m3 of the MFM 3 and the MFCs 1 and 2.

While the disclosure has been shown and described with respect to the embodiments, it will be understood by those skilled in the art that various changes and modifications may be made without departing from the scope of the disclosure as defined in the following claims.

What is claimed is:

1. A raw material gas supply method for supplying a raw material gas obtained by vaporizing a solid or liquid raw material in a raw material container along with a carrier gas to a film forming unit for forming a film on a substrate by using a raw material gas supply apparatus including: a carrier gas supply line for supplying a carrier gas to the raw material container; a bypass channel branched from the carrier gas supply line and connected to the raw material gas supply line while bypassing the raw material container; a dilution gas supply line connected to the raw material gas supply line at a downstream side of a connection portion to which the bypass channel is connected, the dilution gas supply line serving to allow a dilution gas to join with the raw material gas; a first mass flow controller and a second mass flow controller connected to the carrier gas supply line and the dilution gas supply line, respectively; a mass flow meter provided in the raw material gas supply line at a downstream side of a joining portion to which the dilution gas supply line is connected; and a switching mechanism configured to selectively allow a carrier gas to flow through an inside of the raw material container or through the bypass channel, the method comprising:

supplying the raw material gas together with the carrier gas and the dilution gas to the substrate in the film forming unit in a state where the carrier gas flows through the inside of the raw material container; and calculating a remaining amount of the raw material in the raw material container by subtracting, from an amount of the raw material filled in a new raw material container, a cumulative consumption amount including a consumption amount of the raw material which is calculated based on an actual flow rate of the raw material in said supplying the raw material gas to the substrate in the film forming unit, wherein the actual flow rate is obtained by executing:

obtaining an offset value that is a value of $(m3-(m1+m2))$, $m1$, $m2$ and $m3$ being respective measurement values of the first mass controller, the second mass flow controller and the mass flow meter, by supplying the carrier gas and the dilution gas in a state where the carrier gas flows through the bypass channel without flowing through the inside of the raw material container; and obtaining an actual measurement value of a flow rate of the raw material by subtracting the offset value from a value of $(m3-(m1+m2))$ obtained by supplying the carrier gas and dilution gas in a state where the carrier gas flows through the inside of the raw material container without flowing through the bypass channel.

2. The raw material gas supply method of claim 1, wherein the film forming unit performs a film forming process by alternately supplying the raw material gas and a reactant gas that reacts with the raw material gas to the substrate and supplying a replacement gas between the supply of the raw material gas and the supply of the reactant gas, and the measurement values $m1$, $m2$ and $m3$ in said obtaining the value of $(m3-(m1+m2))$ by supplying the carrier gas and the dilution gas in the state where the carrier gas flows through the inside of the raw material container are each obtained by dividing an integration value of the flow rate in n cycle or cycles of supplying the raw material gas and stopping the supply, n being an integer greater than or equal to 1, by a time period T of the cycle or cycles.

3. The raw material gas supply method of claim 2, wherein the measurement values $m1$; $m2$ and $m3$ in said obtaining the value of $(m3-(m1+m2))$ by supplying the carrier gas and the dilution gas in the state where the carrier gas flows through the bypass channel are each obtained by dividing an integration value of the flow rate in the n cycle or cycles by the time period T.

4. The raw material gas supply method of claim 1, the method further comprising:

determining whether the offset value is within a predetermined tolerable range; and if it is determined that the offset value is not within the predetermined tolerable range, activating an alarm to indicate that maintenance of the raw material gas supply apparatus is required.

* * * * *